United States Patent
Hara et al.

(10) Patent No.: US 8,791,734 B1
(45) Date of Patent: Jul. 29, 2014

(54) CASCADED PLL FOR REDUCING LOW-FREQUENCY DRIFT IN HOLDOVER MODE

(71) Applicant: Silicon Laboratories Inc., Austin, TX (US)

(72) Inventors: Susumu Hara, Austin, TX (US); Adam D. Eldredge, Austin, TX (US); Jeffrey S. Batchelor, Austin, TX (US); Daniel Gallant, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/766,035

(22) Filed: Feb. 13, 2013

(51) Int. Cl.
*H03L 7/06* (2006.01)
(52) U.S. Cl.
CPC ........................ *H03L 7/06* (2013.01)
USPC ........... 327/156; 327/158; 327/161; 375/373; 375/375; 375/376
(58) Field of Classification Search
CPC ........................................................ H03L 7/07
USPC ........... 327/156, 158, 161; 375/373, 375, 376
See application file for complete search history.

(56) References Cited

U.S. PATENT DOCUMENTS

| | | | |
|---|---|---|---|
| 6,703,876 B2 * | 3/2004 | Fujiwara et al. | 327/156 |
| 6,970,030 B1 | 11/2005 | Huang et al. | |
| 7,148,753 B1 | 12/2006 | Garlepp et al. | |
| 7,216,249 B2 * | 5/2007 | Fujiwara et al. | 713/501 |
| 7,417,510 B2 | 8/2008 | Huang | |
| 2008/0191762 A1 | 8/2008 | Seethamraju et al. | |

OTHER PUBLICATIONS

U.S. Appl. No. 13/243,149, filed Sep. 23, 2011, entitled "PLL Using Interpolative Divider as Digitally Controlled Oscillator," naming Susumu Hara, Adam B. Eldredge, Zhuo Fu, and James E. Wilson as inventors.
IDT "Enhanced T1/E1/OC3 WAN PLL with Dual Reference Inputs," IDT82V3155, Feb. 20, 2009, 34 pages.
Semtech Corp. "Synchronous Equipment Timing Source for Stratum 3/4E/4 and SMC Systems," ACS8520 Sets, Advanced Communications Final Datasheet, Rev. 3.02, Oct. 2005, 150 pages.
Maxim Integrated Products "Stratum 2/3E/3 Timing Card IC with Synchronous Ethernet Support," Maxim DS3102, 19-4617, Rev. 5, Aug. 2010, 142 pages.

* cited by examiner

Primary Examiner — John Poos
(74) Attorney, Agent, or Firm — Abel Law Group, LLP

(57) ABSTRACT

A cascaded phase-locked loop (PLL) clock generation technique reduces frequency drift of a low-jitter clock signal in a holdover mode. An apparatus includes a first PLL circuit configured to generate a control signal based on a first clock signal and a first divider value. The apparatus includes a second PLL circuit configured to generate the first clock signal based on a low-jitter clock signal and a second divider value. The apparatus includes a third PLL circuit configured to generate the second divider value based on the first clock signal, a third divider value, and a second clock signal. The low-jitter clock signal may have a greater temperature dependence than the second clock signal and the second clock signal may have a higher jitter than the low-jitter clock signal.

27 Claims, 5 Drawing Sheets

CASCADED PLL FOR REDUCING LOW-FREQUENCY DRIFT IN HOLDOVER MODE

BACKGROUND

1. Field of the Invention

This invention relates to integrated circuits and more particularly to clock generator integrated circuits.

2. Description of the Related Art

High speed communication systems require high speed clock signals for transmission and reception of information. In a typical clock generation circuit, a phase-locked loop (PLL) receives a synchronization input reference clock signal and generates one or more high speed clock signals suitable for use in transmitting or receiving data. According to one aspect of such a communication system, when the synchronization input reference clock signal is lost, the system enters a mode known as "holdover" mode and continues to output a clock signal.

The accuracy with which the clock generation circuit provides the clock signal in holdover mode is typically specified in a system standard. The clock generation circuit tries to maintain the output clock signal during holdover mode at a frequency based on a previous reference clock signal. While generating the clock signal in holdover mode, the PLL typically no longer uses feedback to generate the output clock signal. However, the frequency of the clock signal generated in holdover mode may still drift to such an extent as to fail to meet the holdover requirements. For example, certain PLLs may fail to meet holdover requirements because the voltage controlled oscillators utilized in such systems have too much frequency variation over temperature (e.g., 100 ppm/° C.).

Thus techniques that improve an integrated circuit implementation of clock signals generated in a holdover mode that achieves specifications for a high accuracy of the frequency of the output clock signal and low-jitter are desired.

SUMMARY OF EMBODIMENTS OF THE INVENTION

A cascaded phase-locked loop (PLL) clock generation technique reduces frequency drift of a low-jitter clock signal in a holdover mode. In at least one embodiment of the invention, an apparatus includes a first PLL circuit configured to generate a control signal based on a first clock signal and a first divider value. The apparatus includes a second PLL circuit configured to generate the first clock signal based on a low-jitter clock signal and a second divider value. The apparatus includes a third PLL circuit configured to generate the second divider value based on the first clock signal, a third divider value, and a second clock signal. The first PLL may generate an output clock signal based on the control signal and the first clock signal. The first PLL may provide the control signal to the third PLL circuit as the third divider value and may provide the first clock signal as an output clock signal. The low-jitter clock signal may have a greater temperature dependence than the second clock signal and the second clock signal may have a higher jitter than the low-jitter clock signal. In a normal mode, the control signal may be based on a control value generated by the first PLL in response to a valid input clock signal. In a holdover mode, the control signal may be based on a held control value generated by the first PLL in the normal mode, prior to entering a holdover mode.

In at least one embodiment of the invention, a method includes generating an control signal by a first phase-locked loop (PLL) based on a first clock signal and a first divider value. The method includes generating the first clock signal by adjusting a controllable oscillator of a second PLL based on a phase difference between a low-jitter clock signal and the first clock signal frequency-divided according to a second divider value. The method includes generating the second divider value based on a phase difference between a second clock signal and the first clock signal frequency-divided according to a third divider value. The method may include generating an output clock signal based on the control signal and the first clock signal. The method may include providing the control signal to the third PLL circuit as the third divider value and providing the first clock signal as an output clock signal. The low-jitter clock signal may have a greater temperature dependence than the second clock signal. The second clock signal may have a higher jitter than the low-jitter clock signal. In a normal mode, the control signal may be based on a control value generated by the first PLL in response to a valid input clock signal. In a holdover mode, the control signal may be based on a held control value generated by the first PLL in the normal mode, prior to entering the holdover mode.

BRIEF DESCRIPTION OF THE DRAWINGS

The present invention may be better understood by, and its numerous objects, features, and advantages made apparent to, those skilled in the art by referencing the accompanying drawings.

The use of the same reference symbols in different drawings indicates similar or identical items.

DETAILED DESCRIPTION

Figure 1:
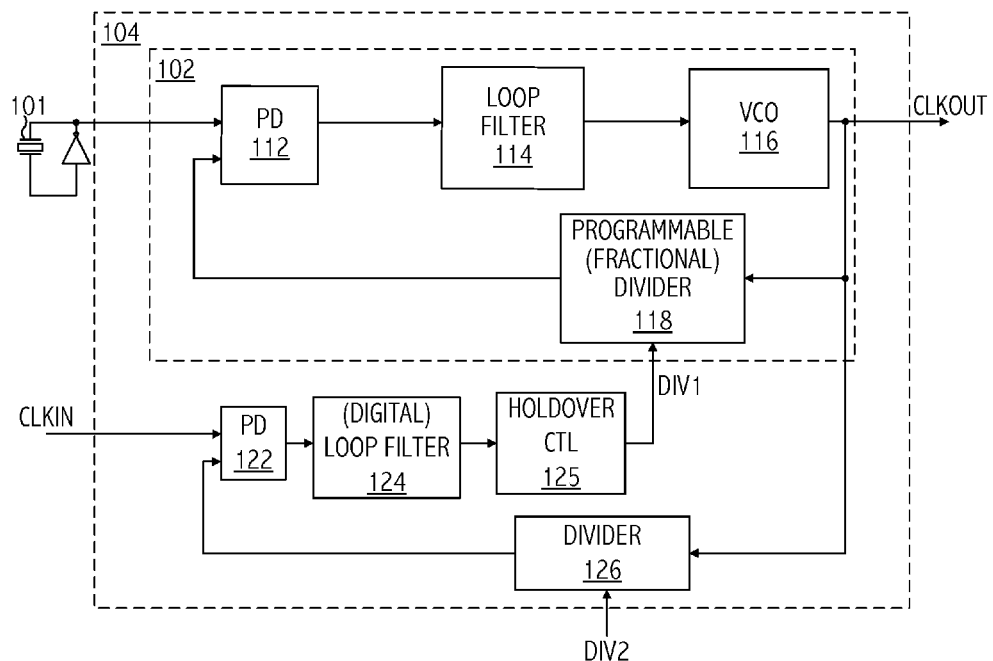
FIG. 1 illustrates a functional block diagram of an exemplary low-jitter clock generation circuit.

Referring to FIG. 1, in an exemplary clock generator including, a multi-loop phase-locked loop (PLL) that generates an output clock signal, CLKOUT, having low jitter by locking an input clock signal, CLKIN, to reference clock source 101. Inner loop 102, is a first PLL that includes phase/frequency detector 112, loop filter 114, and voltage-controlled oscillator 116. Voltage controlled oscillator 116 may be implemented as a ring oscillator, an LC oscillator, or other suitable oscillator structure. Phase/frequency detector 112 receives a clock signal from reference clock source 101, which can be provided by a fixed source such as a crystal oscillator, a microelectromechanical structure (MEMS) oscillator, or other suitable low-jitter source. Outer loop 104 is another PLL that includes phase/frequency detector 122, loop filter 124, and uses inner loop 102 as a digitally controlled oscillator (DCO) responsive to a digital divider ratio, DIV1, which may be a fractional divider value provided by loop filter 124. A typical DCO includes a typical voltage controlled oscillator (e.g., a harmonic oscillator or relaxation oscillator that may include an LC circuit) driven by a control signal from a digital-to-analog converter. Phase/frequency detector 122 receives CLKIN and a feedback signal, which may be a frequency-divided version of CLKOUT. Phase/frequency detector 122 provides a phase error signal reflecting the difference between CLKIN and the feedback signal. The frequency of CLKOUT is determined by the frequency of reference clock source 101 and the divider ratio generated by outer loop 104 and provided to divider 118 in the feedback path of inner loop 102. Outer loop 104 adjusts the divider ratio to match the frequency of CLKOUT to the frequency of CLKIN or to an integer multiple (DIV2) of the frequency of CLKIN (e.g., CLKIN=CLKOUT/DIV2).

When holdover controller 125 detects a holdover condition, that is, when reference clock signal CLKIN is invalid, which may be indicated by a loss of signal condition indicator or an out-of-frequency condition indicator, holdover controller 125 "freezes" loop filter 124 of PLL 104 such that the divider ratio provided to divider 118, DIV1, no longer tracks changes to CLKIN, and selects a held output of the loop filter 124, or a value based on a held output of loop filter 124, to be provided to divider 118, thereby holding steady the frequency of CLKOUT. For example, holdover control 125 of outer loop 104 holds the output of loop filter 124 to a value corresponding to a value of CLKIN received prior to entering the holdover mode so that no updating of DIV1 occurs. In at least one embodiment of the clock generator, during holdover mode, feedback divider ratio provided by the outer loop to divider 118 is based on past divider values (e.g., is an average of past divider values). Techniques for generating a clock signal in a holdover mode are described in U.S. patent application Ser. No. 10/453,990, filed Jun. 4, 2003, entitled "Method and Apparatus for Generating a Clock Signal in Holdover Mode," naming Bruno W. Garlepp and Gerard Pepenella as inventors, now U.S. Pat. No. 7,148,753, and in U.S. patent application Ser. No. 11/673,819, filed Feb. 12, 2007, entitled "Digital Hold in a Phase-Locked Loop," naming Srisai R. Seethamraju, Jerrell P. Hein, Kenneth Kin Wai Wong, and Qicheng Yu as inventors, which applications are incorporated by reference herein. When the divide ratio is frozen, the output frequency of CLKOUT varies only based on frequency variation of the reference clock source 101. A typical reference clock source 101 is a relatively low-cost clock source having a jitter performance that satisfies jitter specifications for a target application. Such typical reference clock sources generate signals having a frequency that is highly dependent on temperature (e.g., approximately 15 parts-per-million (ppm)). Such poor temperature stability of reference clock source 101 results in CLKOUT having low-frequency drift after a loss of the input clock signal, CLKIN. That low-frequency drift may be unacceptable for a target application.

Figure 2:
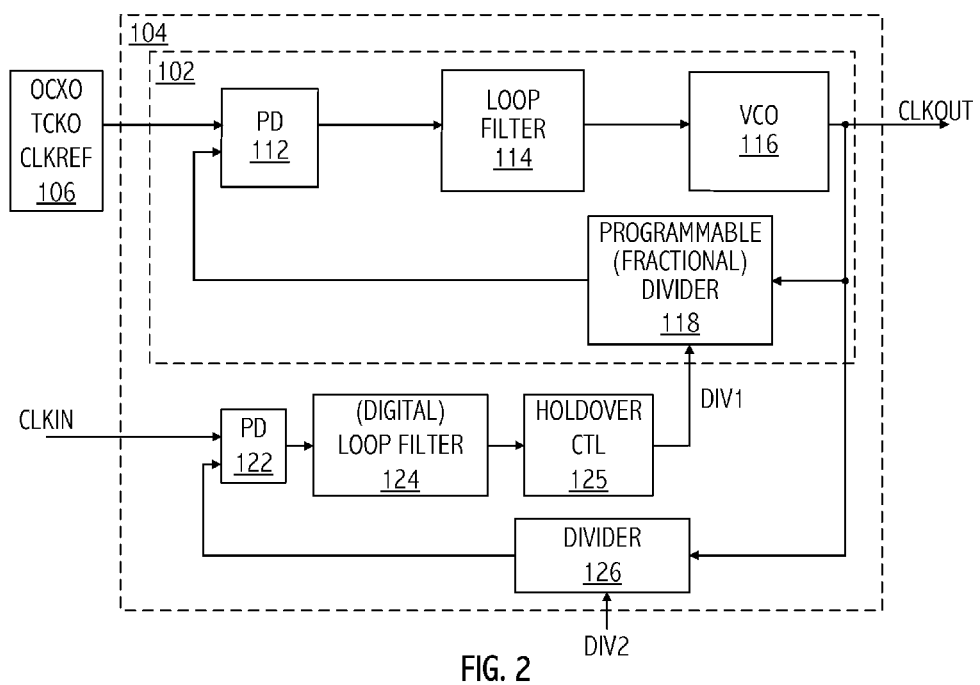
FIG. 2 illustrates a functional block diagram of an exemplary temperature-stable clock generation circuit.

Referring to FIG. 2, a technique that improves the temperature stability of an output clock signal when the input clock signal disappears (i.e., reduces low-frequency drift after loss of the input clock signal, CLKIN), locks inner loop 102, which is used as the digitally controlled oscillator for outer loop 104, to a temperature-stable reference clock signal generated by a frequency-stable reference clock having high temperature stability. For example, an oven-controlled crystal oscillator (OCXO) or temperature-compensated crystal oscillator (TCXO) may be used instead of low-jitter reference clock source 101, which may be a crystal oscillator. In holdover mode, holdover control 125 of outer loop 104 provides a frozen feedback divider ratio (e.g., a value of DIV1 that is based on one or more past divider values determined during normal mode based on a valid clock signal). However, this approach does not achieve low-jitter clock generation in the absence of the input clock signal because the OCXO or TCXO typically has higher jitter and/or lower oscillation frequencies than reference clock source 101 of FIG. 1.

Figure 3:
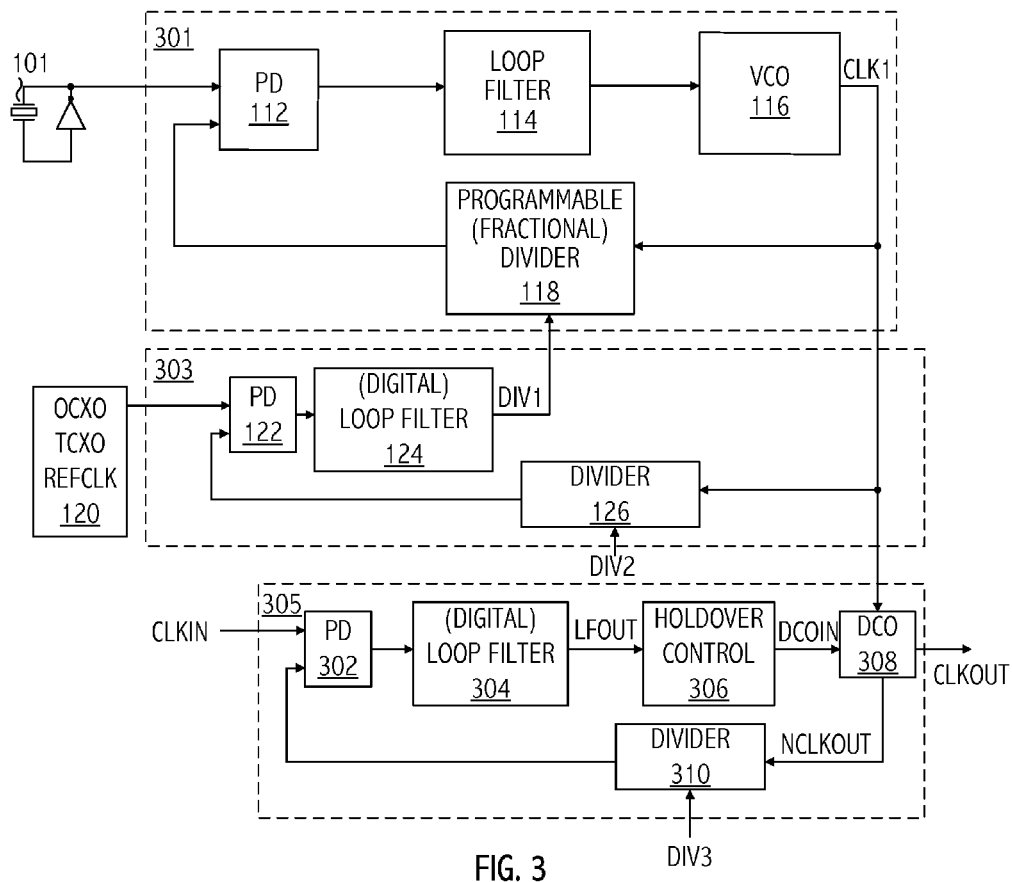
FIG. 3 illustrates a functional block diagram of a cascaded PLL clock generation circuit consistent with at least one embodiment of the invention.

Referring to FIG. 3, a clock generation technique reduces frequency drift of a low-jitter clock signal in a holdover mode. In at least one embodiment, a clock generator includes multiple cascaded PLLs to lock a frequency stable, low-jitter clock signal to an input clock signal to generate an output clock signal in a normal mode (i.e., in response to detection of a valid input clock signal). In a holdover mode (i.e., in the absence of a valid input clock signal), the multiple cascaded PLLs provide a frequency stable, low-jitter clock signal using a control value based on one or more past control values. An inner loop PLL, PLL 301, generates a frequency-stable, low-jitter clock signal, CLK1, based on a low-jitter reference clock signal provided by clock source 101, e.g., a crystal, and a divider value, DIV1. The divider value, DIV1, which may be an integer divider value or a fractional divider value, is dynamically updated and provided to PLL 301 by an outer loop PLL, PLL 303. Phase-locked loop 303 generates the dynamically updated divider value based on CLK1, a predetermined divider value, DIV2, and a temperature-stable reference signal provided by reference clock 120, which may be an OCXO, a TCXO, or other suitable temperature-stable reference clock. Note that temperature-stable reference clock source 120 need not provide a low-jitter reference signal. Phase-locked loop 303 locks DIV1 to a divider value that locks CLK1 to the signal generated by frequency-stable reference clock 120. Predetermined divider value DIV2 may be provided to divider 126 by a storage device and/or provided by a terminal of an integrated circuit including the clock generator. The value of DIV2 is based on a ratio of the frequency of frequency-stable reference clock source 120 and a target frequency of CLK1. Divider value DIV2 may be an integer or a fractional divider value and divider 126 may be any suitable integer or fractional frequency-dividing circuit.

Still referring to FIG. 3, another outer-loop PLL, PLL 305, locks the output clock signal, CLKOUT, to an input clock signal, CLKIN, when the input clock signal is valid. Phase-locked loop 305 includes holdover functionality and generates a low-jitter, frequency-stable clock signal in the absence of a valid CLKIN signal. For example, when in the normal mode of operation, PLL 305 locks to CLKIN and holdover control 306 provides the updated output value of loop filter 304 to DCO 308. Thus, when CLKIN is valid, DCO 308 is controlled by the output of loop filter 304. Meanwhile, holdover controller 306 stores at least one value based on the output value of loop filter 304 in a holdover storage element. When in a holdover mode (e.g., CLKIN is invalid), holdover controller 306 provides to DCO 308 a control value based on a frozen value of the output of loop filter 304 from the holdover storage element, and DCO 308 no longer tracks changes to CLKIN. The frequency stability of the output clock, CLKOUT, is determined by the frequency stability of DCO 308, which is based on the frequency-stable clock signal being locked to a low-jitter clock signal by PLL 301 and PLL 303.

Figure 4:
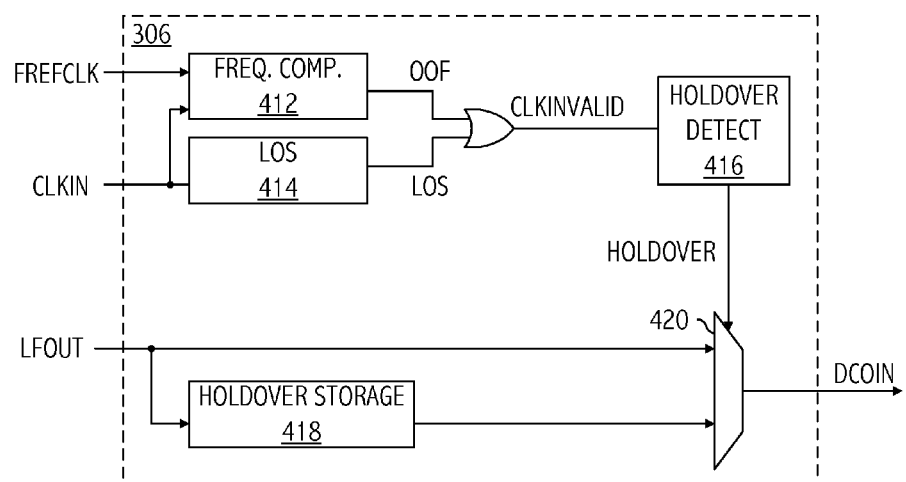
FIG. 4 illustrates a functional block diagram of holdover circuitry of the clock generation circuit of FIG. 3, consistent with at least one embodiment of the invention.

In at least one embodiment of a clock generator, holdover controller 306 implements a technique for validating the input clock that determines whether CLKIN exists and/or whether the frequency of CLKIN is within an expected range. Referring to FIG. 4, frequency comparator 412 generates an indication of whether the input clock signal, CLKIN, has a frequency in the range of the frequency of a frequency reference clock signal, FREFCLK. Loss-of-signal detector 414 determines whether CLKIN is present. If either the frequency of the input clock signal is out of the target frequency range or a loss-of-signal condition is detected, holdover mode detector 416 generates an indication that the input clock signal is invalid. That indicator may be buffered in a storage element of holdover mode detector 416. Holdover mode detector 416 provides an indication of the holdover mode to a select circuit (e.g., multiplexer 420), which selects a digital control value to be provided to DCO 308. For example, when the holdover mode is enabled, holdover controller 306 provides a value of the output of the digital loop filter 304 that has been stored in a holdover storage element 418. Otherwise, holdover controller 306 provides a dynamically updated output of loop filter 304 to DCO 308.

Figure 5:
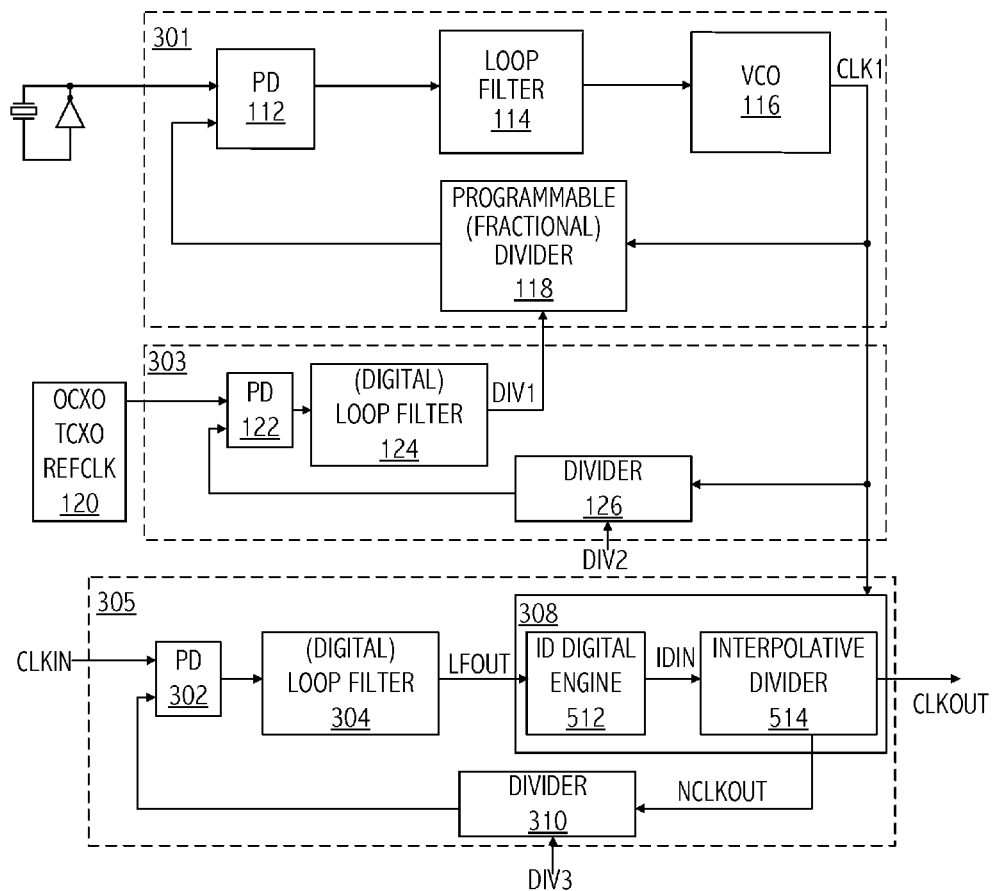
FIG. 5 illustrates a functional block diagram of a cascaded PLL clock generation circuit including an interpolative divider consistent with at least one embodiment of the invention.

Referring to FIG. 5, in at least one embodiment of a clock generator implementing the cascaded PLL technique, interpolative divider digital engine 512 and interpolative divider 514, which includes a frequency divider and a phase interpolator, are incorporated as a digitally controlled oscillator in the forward path of PLL 305. Interpolative divider digital engine 512 includes the holdover control functionality described above and generates frequency divider and phase error correction control values based on a frozen value of the output of loop filter 304 in holdover mode. The phase interpolator of interpolative divider 514 adjusts the phase of frequency-divided CLK1 according to the digital quantization error to reduce error in CLKOUT. Interpolative divider digital engine 512 may include a typical sigma-delta modulator that generates the control signals IDIN, which include a frequency divider control code and a phase interpolator control code, based on the output of loop filter 304 in a normal mode of operation. Interpolative divider 514 frequency divides CLK1 according to the divide ratio and adjusts the phase of the frequency-divided signal to generate NCLKOUT, which may be equal to CLKOUT or may be an integer multiple of CLKOUT. The output of the interpolative divider is supplied to feedback frequency divider 310 of PLL 305. Interpolative divider techniques are described in U.S. patent application Ser. No. 13/243,149, filed Sep. 23, 2011, entitled "PLL Using Interpolative Divider as Digitally Controlled Oscillator," naming Susumu Hara, Adam B. Eldredge, Zhou Fu, and James E. Wilson as inventors, and in U.S. Pat. No. 7,417,510, filed Oct. 17, 2006, entitled "Direct Digital Interpolative Synthesis," naming Yunteng Huang as inventor, which applications are incorporated by reference herein.

Referring to FIGS. 3 and 5, feedback frequency divider 310 supplies the frequency-divided signal to phase detector 302. Note that although feedback frequency divider 310 is included in FIG. 5, in other embodiments of a cascaded PLL technique, feedback frequency divider 310 may be omitted, in which case CLKOUT is fed back to phase detector 302. Phase detector 302 also receives as the input signal CLKIN to which PLL 305 is designed to lock. Phase detector 302 supplies a phase error signal reflecting the difference between the CLKIN signal and the feedback signal to loop filter 304, which in an embodiment is an all digital loop filter. Loop filter 304 may be configured as a low pass filter. A filtered phase error signal is used to generate control signal(s) for DCO 308 of FIG. 3 or control signals IDIN of FIG. 5. Note that initial control signals (e.g., initial values of IDIN for interpolative divider 514 of FIG. 5 for an initial divide ratio) may be provided to PLL 305 from a storage element (e.g., volatile or non-volatile memory). Those initial control signals may be selected according to, e.g., the target output frequency of CLKOUT, the frequency of CLKIN, and the frequency of CLK1.

Figure 6:
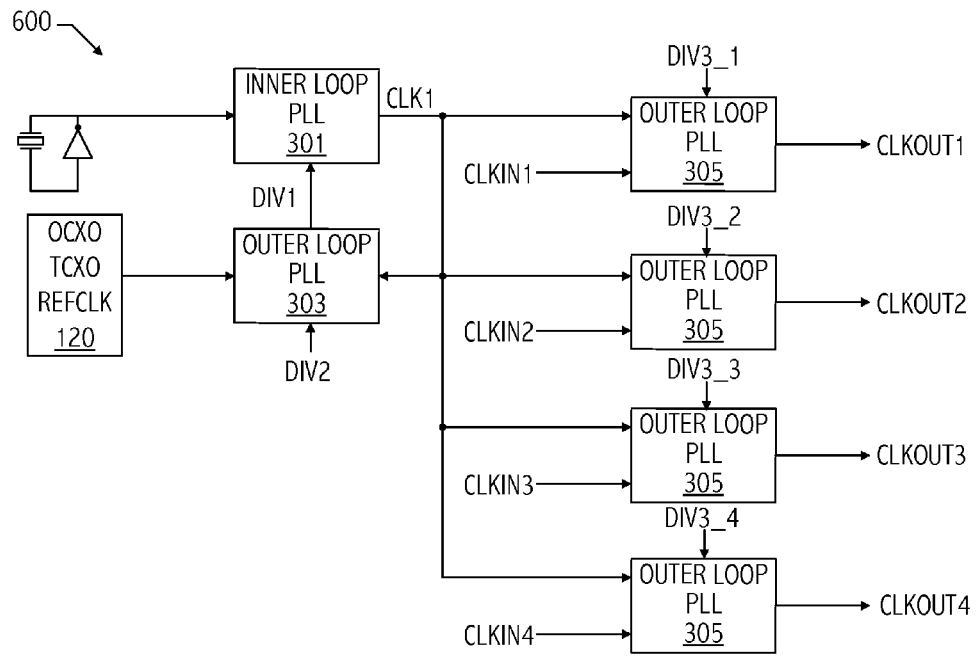
FIG. 6 illustrates a functional block diagram of a cascaded PLL clock generation circuit configured to generate multiple clock signals consistent with at least one embodiment of the invention.
Figure 7:
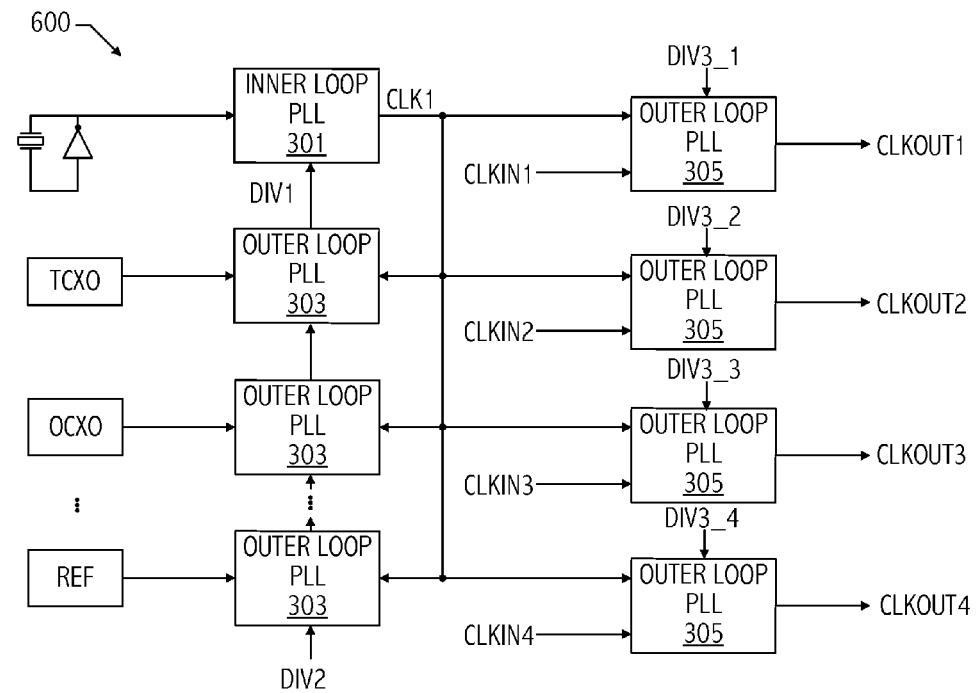
FIG. 7 illustrates a functional block diagram of a cascaded PLL clock generation circuit configured to generate multiple clock signals consistent with at least one embodiment of the invention.

Cascaded PLL techniques described above may be implemented in a clock generator that generates multiple low-jitter, frequency-stable clock signals. Referring to FIGS. 6 and 7, PLL 301 and PLL 303, described above with respect to FIGS. 3 and 5, are configured to provide a frequency-stable, low-jitter clock signal to multiple outer loop PLLs 305. Each outer loop PLL 305 may be separately configured to generate an output clock signal, CLKOUT1, CLKOUT2, CLKOUT3, and CLKOUT4, having a different frequency based on corresponding input clock signals CLKIN1, CLKIN2, CLKIN3, and CLKIN4, respectively, and corresponding divider values, DIV3_1, DIV3_2, DIV3_3, and DIV3_4, respectively. In at least one embodiment, of a clock generator, each outer loop PLL 305 includes a typical DCO, as described above, in DCO 308. Referring to FIG. 7, clock generator 600 may receive signals from additional reference clock generators (e.g., a TCXO, an OCXO, another reference clock generator, and/or other reference clock generators) coupled to additional corresponding outer loop PLLs 303 cascaded with inner loop PLL 301 to adjust the phase noise of the output clock signal(s) for a particular application.

Referring back to FIGS. 6 and 7, in at least one embodiment of a clock generator 600, instead of including a typical DCO (e.g., a voltage-controlled oscillator based PLL), each outer loop PLL 305 includes an interpolative divider and associated digital logic as DCO 308, as illustrated in FIG. 5. Referring back to FIG. 6, eliminating the typical DCOs from outer loop PLLs 305 reduces the size of the clock generator as compared to embodiments including typical DCOs in outer loop PLLs 305. In addition, the use of the interpolative divider as a DCO allows use of digital loop filters in the outer loop PLLs 305, which typically are smaller than analog loop filters. Thus, the clock generator of FIG. 6 can generate multiple output clock signals each having a different output frequency using one voltage controlled oscillator in a core PLL (e.g., inner loop PLL 301). In addition, eliminating the digitally controlled oscillators in outer loop PLLs 305, reduces or eliminates cross talk that may result from multiple LC oscillators used in clock generators with multiple voltage controlled oscillators.

Figure 8:
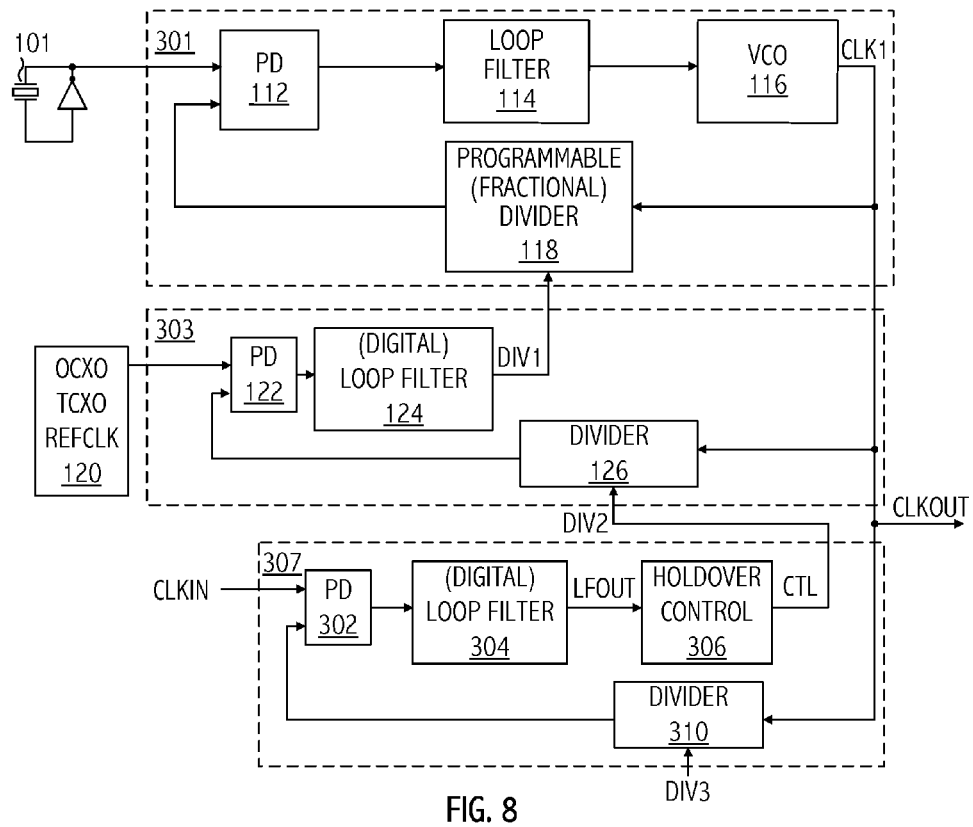
FIG. 8 illustrates a functional block diagram of a cascaded PLL clock generation circuit consistent with at least one embodiment of the invention.
Figure 9:
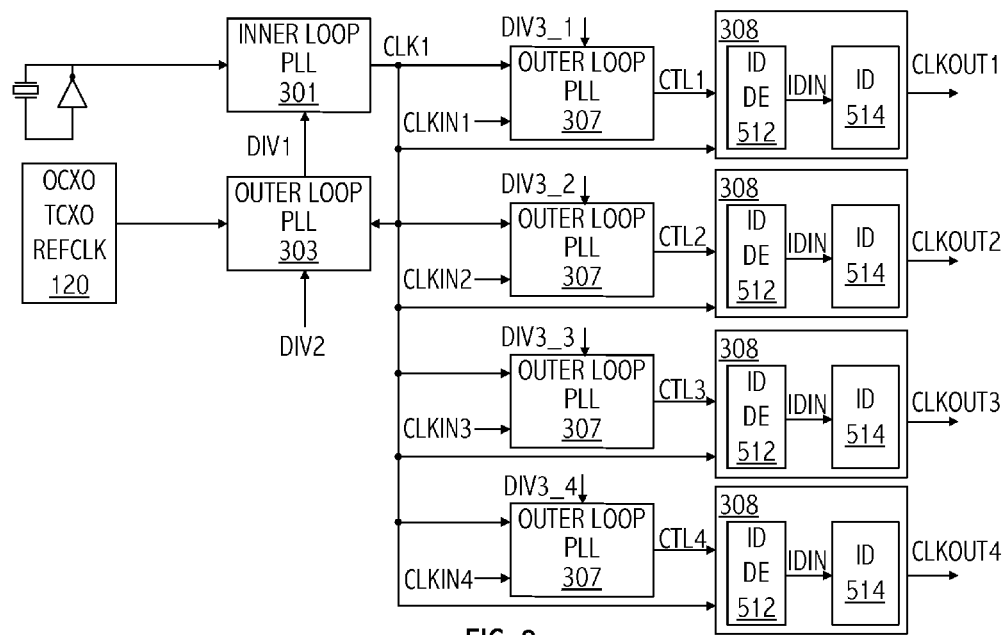
FIG. 9 illustrates a functional block diagram of a cascaded PLL clock generation circuit configured to generate multiple clock signals consistent with at least one embodiment of the invention.

Referring to FIG. 8, in at least one other embodiment of a clock generator, an outer loop 307 is included instead of outer loop PLL 305. Outer loop PLL 307 excludes the DCO altogether and provides the control signal output as the divider value for feedback frequency divider 126 of PLL 303. The clock generator provides CLK1 as the output clock signal or provides CLK1 to another frequency divider that generates the output clock signal (not shown). However, to generate multiple output clock signals CLKOUT1, CLKOUT2, CLKOUT3, and CLKOUT4 based on multiple corresponding input clock signals CLKIN1, CLKIN2, CLKIN3, and CLKIN4, respectively, and multiple corresponding divider values DIV3_1, DIV3_2, DIV3_3, and DIV3_4, respectively, using outer loop PLL 307 of FIG. 8, the clock generator also includes multiple DCOs 308 (e.g., corresponding interpolative dividers and associated digital logic configured as DCOs 308) to generate the multiple corresponding output clock signals based on CLK1 and the multiple corresponding control signal outputs CTL1, CTL2, CTL3, and CTL4, respectively, of outer loop PLLs 307.

The description of the invention set forth herein is illustrative, and is not intended to limit the scope of the invention as set forth in the following claims. For example, while the invention has been described in an embodiment in which feedback frequency dividers are included in the outer loop PLLs, one of skill in the art will appreciate that the teachings herein can be utilized with a feedback divide ration of one and divider 126 or divider 310 may be excluded. Variations and modifications of the embodiments disclosed herein, may be made based on the description set forth herein, without departing from the scope and spirit of the invention as set forth in the following claims.

What is claimed is:

1. An apparatus comprising:
   a first phase-locked loop (PLL) circuit configured to generate a control signal based on a first clock signal and a first divider value;
   a second PLL circuit configured to generate the first clock signal based on a low-jitter clock signal and a second divider value; and
   a third PLL circuit configured to generate the second divider value based on the first clock signal, a third divider value, and a second clock signal.

2. The apparatus, as recited in claim 1, wherein the first PLL is further configured to generate an output clock signal based on the control signal and the first clock signal.

3. The apparatus, as recited in claim 1, wherein the first PLL is further configured to provide the control signal to the third PLL circuit as the third divider value, wherein the first clock signal is provided as an output clock signal.

4. The apparatus, as recited in claim 1, wherein the low-jitter clock signal has a greater temperature dependence than the second clock signal and the second clock signal has a higher jitter than the low-jitter clock signal.

5. The apparatus, as recited in claim 1, wherein in a normal mode, the control signal is based on a control value generated by the first PLL in response to a valid input clock signal and in a holdover mode, the control signal is based on a held control value generated by the first PLL in the normal mode, prior to entering the holdover mode.

6. The apparatus, as recited in claim 5, wherein the control value is based on an output of a loop filter of the first PLL in response to the valid input clock signal and in the holdover mode, the control value is based on a prior output of the loop filter of the first PLL.

7. The apparatus, as recited in claim 1, wherein the first PLL comprises:
   an interpolative divider configured to generate an output clock signal based on the first clock signal and the control signal.

8. The apparatus, as recited in claim 1, wherein the first PLL circuit comprises:
   a first phase detector configured to generate a first phase error corresponding to a difference between the input clock signal and a first feedback signal;
   a first loop filter configured to generate a first filtered phase error based on an output of the first phase detector;
   a digital circuit configured to generate the value of the control signal based on the first filtered phase error in response to a valid input clock signal and configured to provide a prior value of the control signal based on a prior first filtered phase error in the holdover mode;
   a digitally-controlled oscillator circuit configured to generate a first signal and an output clock signal based on the control signal and the first clock signal; and
   a first divider circuit configured to generate the first feedback signal based on the first signal and the first divider value.

9. The apparatus, as recited in claim 8, wherein the second PLL circuit comprises:
   a second phase detector configured to generate a second phase error corresponding to a difference between the low-jitter clock signal and a second feedback signal;
   a second loop filter configured to generate a filtered phase error based on an output of the second phase detector;
   a voltage-controlled oscillator configured to generate the first clock signal based on the filtered phase error; and
   a programmable divider configured to generate the second feedback signal based on an output of the voltage-controlled oscillator and the second divider value.

10. The apparatus, as recited in claim 9, wherein the third PLL circuit comprises:
    a third phase detector configured to generate a third phase error corresponding to a difference between the second clock signal and a third feedback signal;
    a third loop filter configured to generate a third filtered phase error based on an output of the third phase detector; and
    a second divider configured to generate the third feedback signal based on the first clock signal and a third divider value.

11. The apparatus, as recited in claim 1, further comprising:
    an additional PLL circuit configured to generate an additional control signal based on the first clock signal and an additional divider value.

12. The apparatus, as recited in claim 1, wherein the second clock signal is received from a frequency-stable reference clock having high temperature stability.

13. A method comprising:
    generating a control signal by a first phase-locked loop (PLL) based on a first clock signal and a first divider value;
    generating the first clock signal by adjusting a controllable oscillator of a second PLL based on a phase difference between a low-jitter clock signal and the first clock signal frequency-divided according to a second divider value; and
    generating the second divider value based on a phase difference between a second clock signal and the first clock signal frequency-divided according to a third divider value.

14. The method, as recited in claim 13, further comprising:
    generating an output clock signal based on the control signal and the first clock signal.

15. The method, as recited in claim 13, further comprising:
    providing the control signal to the third PLL circuit as the third divider value; and
    providing the first clock signal as an output clock signal.

16. The method, as recited in claim 13, wherein the low-jitter clock signal has a greater temperature dependence than the second clock signal and the second clock signal has a higher jitter than the low-jitter clock signal.

17. The method, as recited in claim 13, wherein in a normal mode, the control signal is based on a control value generated by the first PLL in response to a valid input clock signal and in a holdover mode, the control signal is based on a held control value generated by the first PLL in the normal mode, prior to entering the holdover mode.

18. The method, as recited in claim 13, wherein generating the control signal comprises:
   generating the control signal to have a value based on a filtered phase error corresponding to a difference between an input clock signal and a feedback clock signal of the first PLL in response to a valid input clock signal; and
   in a holdover mode, generating the control signal to have a value based on a filtered phase error prior to entering the holdover mode.

19. The method, as recited in claim 13, wherein the control signal is based on an output of a loop filter of the first PLL in response to the valid input clock signal and in the holdover mode, the control signal is based on a prior output of the loop filter of the first PLL.

20. The method, as recited in claim 13, further comprising:
   adjusting a phase of a frequency-divided version of the first clock signal according to a phase error control signal included in the control signal to thereby generate an output clock signal.

21. The method, as recited in claim 13, further comprising:
   generating a first phase error corresponding to a difference between the input clock signal and a first feedback signal;
   generating a first filtered phase error based on an output of the first phase detector;
   generating the value of the control signal based on the first filtered phase error in response to the valid input clock signal and providing the prior value of the control signal based on a prior first filtered phase error in the holdover mode;
   generating a first signal and an output clock signal based on the control signal and the first clock signal of the voltage-controlled oscillator; and
   generating the first feedback signal based on the first signal and the first divider value.

22. The method, as recited in claim 21, wherein generating the first clock signal comprises:
   generating a second phase error corresponding to a difference between the low-jitter clock signal and a second feedback signal;
   generating a filtered phase error based on an output of the second phase detector;
   generating the first clock signal based on the filtered phase error; and
   generating the second feedback signal based on an output of the voltage-controlled oscillator and the second divider value.

23. The method, as recited in claim 22, wherein generating the second feedback signal comprises:
   generating a third phase error corresponding to a difference between the second clock signal and a third feedback signal;
   generating the third feedback signal based on the first clock signal and a third divider value; and
   generating the second divider value by filtering the third phase error.

24. An apparatus comprising:
   means for generating a control signal based on a first clock signal in response to a valid input clock signal and for generating the control signal in an absence of the valid input clock signal;
   means for generating the first clock signal based on a phase difference between a low-jitter reference clock signal and the first clock signal frequency-divided according to a first divider value; and
   means for generating the first divider value based on a second clock signal and the first clock signal frequency-divided according to a second divider value.

25. The apparatus, as recited in claim 24, further comprising:
   means for generating an output clock signal based on the control signal and the first clock signal.

26. The apparatus, as recited in claim 24, wherein the low-jitter clock signal has a greater temperature dependence than the second clock signal and the second clock signal has a higher jitter than the low-jitter clock signal.

27. The apparatus, as recited in claim 24, further comprising:
   means for detecting the absence of the valid input clock signal.

* * * * *

UNITED STATES PATENT AND TRADEMARK OFFICE
CERTIFICATE OF CORRECTION

| | | |
|---|---|---|
| PATENT NO. | : 8,791,734 B1 | |
| APPLICATION NO. | : 13/766035 | |
| DATED | : July 29, 2014 | |
| INVENTOR(S) | : Susumu Hara et al. | |

It is certified that error appears in the above-identified patent and that said Letters Patent is hereby corrected as shown below:

On the title page, item [72] Inventors, replace "Adam D. Eldredge" with --Adam B. Eldredge--.

Signed and Sealed this
Third Day of February, 2015

Michelle K. Lee
*Deputy Director of the United States Patent and Trademark Office*